United States Patent [19]

Blalock et al.

[11] Patent Number: 5,238,862
[45] Date of Patent: Aug. 24, 1993

[54] METHOD OF FORMING A STACKED CAPACITOR WITH STRIATED ELECTRODE

[75] Inventors: Guy Blalock; Phillip G. Wald, both of Boise, Id.

[73] Assignee: Micron Technology, Inc., Boise, Id.

[21] Appl. No.: 854,435

[22] Filed: Mar. 18, 1992

[51] Int. Cl.⁵ .................... H01L 21/70; H01L 27/00
[52] U.S. Cl. ........................................ 437/52; 437/47; 437/60; 437/228; 437/233; 437/919; 156/644; 156/646; 156/653; 257/303; 257/309
[58] Field of Search ............... 437/60, 47, 52, 919, 437/915; 148/DIG. 14; 257/303, 309

[56] References Cited

U.S. PATENT DOCUMENTS

| | | | |
|---|---|---|---|
| 5,049,517 | 9/1991 | Liu et al. | 437/52 |
| 5,068,199 | 11/1991 | Sandhu | 437/52 |
| 5,082,797 | 1/1992 | Chan et al. | 437/52 |
| 5,110,752 | 5/1992 | Lu | 437/47 |
| 5,164,881 | 11/1992 | Ahu | 437/52 |

OTHER PUBLICATIONS

T. Ema et al., "3-Dimensional Stacked Capacitor Cell For 16M and 64M DRAMS," IEDM Tech. Digest, pp. 592, 595, 1988.

S. Inoue et al., "A Spread Stacked Capacitor (SSC) Cell For 64MBit DRAMs," IEDM Tech. Digest, pp. 31-34, 1989.

*Primary Examiner*—Olik Chaudhuri
*Assistant Examiner*—H. Jey Tsai
*Attorney, Agent, or Firm*—Wells, St. John, Roberts, Gregory & Matkin

[57] ABSTRACT

A method of forming a capacitor on a semiconductor wafer includes: a) in a dry etching reactor, selectively anisotropically dry etching a capacitor contact opening having a minimum selected open dimension into an insulating dielectric layer utilizing selected gas flow rates of a reactive gas component and an inert gas bombarding component, the flow rate of the bombarding component significantly exceeding the flow rate of the reactive component to effectively produce a capacitor contact opening having grooved striated sidewalls and thereby defining female capacitor contact opening striations; b) providing a layer of an electrically conductive storage node material within the striated capacitor contact opening; c) removing at least a portion of the conductive material layer to define an isolated capacitor storage node within the insulating dielectric having striated sidewalls; d) etching the insulating dielectric layer selectively relative to the conductive material sufficiently to expose at least a portion of the external male striated conductive material sidewalls; and e) providing conformal layers of capacitor dielectric and capacitor cell material atop the etched conductive material and over its exposed striated sidewalls. The invention also includes a stacked capacitor construction having an electrically conductive storage node with upwardly rising external sidewalls. Such sidewalls have longitudinally extending striations to maximize surface area and corresponding capacitance in a resulting construction.

14 Claims, 7 Drawing Sheets

METHOD OF FORMING A STACKED CAPACITOR WITH STRIATED ELECTRODE

TECHNICAL FIELD

This invention relates generally to three dimensional stack capacitors and the fabrication thereof.

BACKGROUND OF THE INVENTION

As DRAMs increase in memory cell density, there is a continuous challenge to maintain sufficiently high storage capacitance despite decreasing cell area. A principal way of increasing cell capacitance is through cell structure techniques. Such techniques include three dimensional cell capacitors such as trenched or stacked capacitors. This invention concerns stacked capacitor cell constructions.

With the conventional stacked capacitor, the capacitor is formed immediately above and electrically connected to the active device area of the associated MOS transistor of the memory cell. Typically, only the upper surface of the lower storage polysilicon node of the capacitor is utilized for capacitance. However, some attempts have been made to provide constructions to increase capacitance, whereby the back side of one capacitor terminal is used to store charge. Such is shown by way of example by T. Ema et al. "3-Dimensional Stacked Capacitor Cell For 16M and 64M DRAMS", IEDM Tech. Digest, pp. 592, 595, 1988 and S. Inoue et al., "A spread Stacked Capacitor (SSC) Cell For 64MBit DRAMs", IEDM Tech. Digest, pp. 31-34, 1989.

Figure 1:
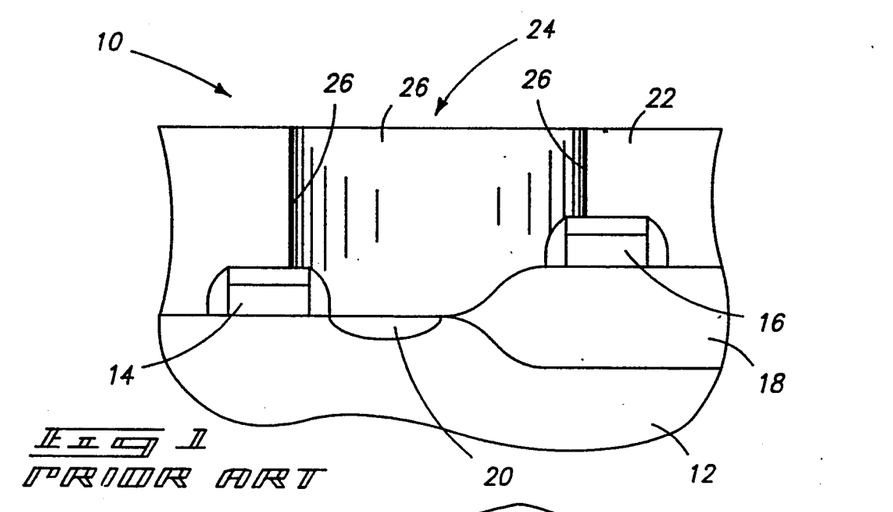
FIG. 1 is a cross sectional/elevational view of a semiconductor wafer fragment processed in accordance with prior art techniques, and is described in the "Background" section above.
Figure 2:
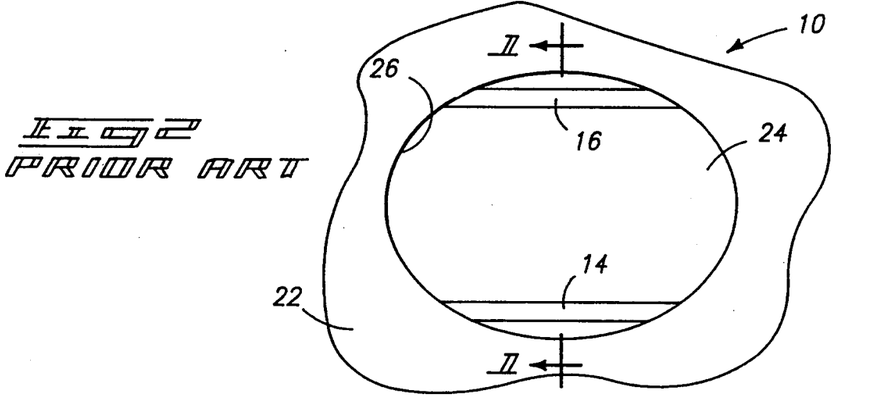
FIG. 2 is a top view of the FIG. 1 wafer fragment, with the line 1—1 illustrating where the FIG. 1 section cut is taken.

One standard prior art technique for forming a stacked "crown" cell capacitor is described with reference to FIGS. 1-4. "Crown" capacitors are characterized by upward spire-like, or fin-like projections, thereby increasing surface area and corresponding capacitance as compared to planar capacitors. FIG. 1 illustrates a semiconductor wafer fragment 10 comprised of a bulk substrate 12, word lines 14, 16, field oxide region 18, and an active area 20 for connection with a capacitor. Wafer 10 also comprises a layer of insulating dielectric 22 through which a desired contact opening 24 has been provided to active area 20. Referring to FIGS. 1 and 2, contact opening 24 has an elliptical or circular shape with walls 26. The vertical lines illustrated in FIG. 1 illustrate shading only for identifying sidewalls 26 and depicting a smooth surface which arcs into the page. Such lines do not indicate texture or other patterning. Sidewalls 26 are typically smooth and straight. The elliptical shape of contact 24 can be produced by depositing a photoresist film over the bulk substrate 10 and transferring the contact 24 pattern by photolithographic means using the proper image mask.

Figure 3:
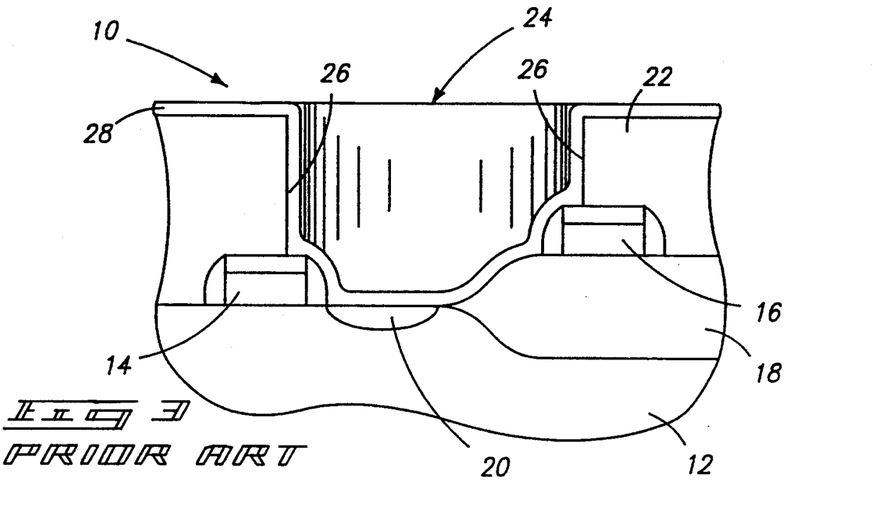
FIG. 3 is a cross sectional/elevational view of the FIG. 1 wafer fragment illustrated at a processing step subsequent to that shown by FIGS. 1 and 2.

Referring to FIG. 3, a layer 28 of conductive material, such as conductively doped polysilicon, is deposited atop wafer 10 and to within contact opening 24. Layer 28 will provide the storage node poly for formation of one of the capacitor plates.

Figure 4:
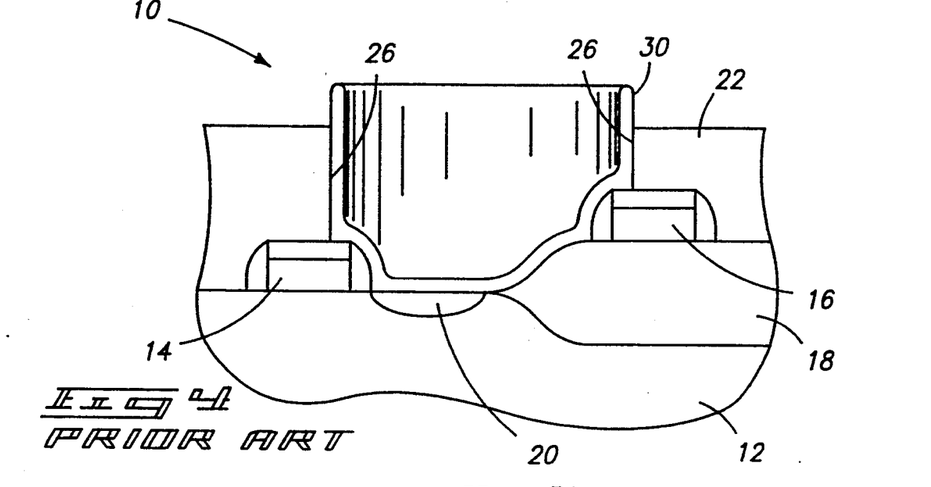
FIG. 4 is a cross sectional/elevational view of the FIG. 1 wafer fragment illustrated at a processing step subsequent to that shown by FIG. 3.

Referring to FIG. 4, polysilicon layer 28 is first chemical mechanical polished or resist planerization dry etched to be flush with the upper surface of insulating layer 22. Thereafter, insulating layer 22 is etched selectively relative to polysilicon to produce an isolated storage node 30 having the illustrated crown portions projecting upwardly from layer 22. Thereafter, a cell dielectric would be deposited, followed by a cell polysilicon layer to complete the capacitor construction.

It is an object of this invention to enable such and similar stacked capacitor constructions to have increased capacitance.

BRIEF DESCRIPTION OF THE DRAWINGS

Preferred embodiments of the invention are described below with reference to the following accompanying drawings.

DETAILED DESCRIPTION OF PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a capacitor on a semiconductor wafer comprises the following steps:
 providing a layer of insulating dielectric atop a semiconductor wafer to a selected thickness;
 in a dry etching reactor, selectively anisotropically dry etching a capacitor contact opening having a minimum selected open dimension into the insulating dielectric layer utilizing selected gas flow rates of a reactive gas component and an inert gas bombarding component, the flow rate of the bombarding component significantly exceeding the flow rate of the reactive component to effectively produce a capacitor contact opening having grooved striated sidewalls and thereby defining female capacitor contact opening striations;

providing a layer of electrically conductive material atop the wafer and within the striated capacitor contact opening to a selected thickness which is less than the selected open dimension, the electrically conductive material filling the grooved striations of the capacitor contact opening thereby defining striated external conductive material sidewalls within the capacitor contact opening which are male complementary in shape to the female capacitor contact opening striations;

removing at least a portion of the conductive material layer to define an isolated capacitor storage node within the insulating dielectric;

etching the insulating dielectric layer selectively relative to the conductive material sufficiently to expose at least a portion of the external male striated conductive material sidewalls;

providing a conformal capacitor dielectric layer atop the etched conductive material and over its exposed striated sidewalls; and providing a conformal capacitor cell layer of electrically conductive material atop the capacitor dielectric layer.

In accordance with another aspect of the invention, a stacked capacitor construction formed within a semiconductor substrate comprises:

an electrically conductive storage node, the storage node having upwardly rising external sidewalls, the upwardly rising external sidewalls having longitudinally extending striations to maximize surface area and corresponding capacitance;

a striated cell dielectric layer provided over the storage node and its associated longitudinally extending striations; and an electrically conductive striated cell layer provided over the striated cell dielectric layer.

Figure 5:
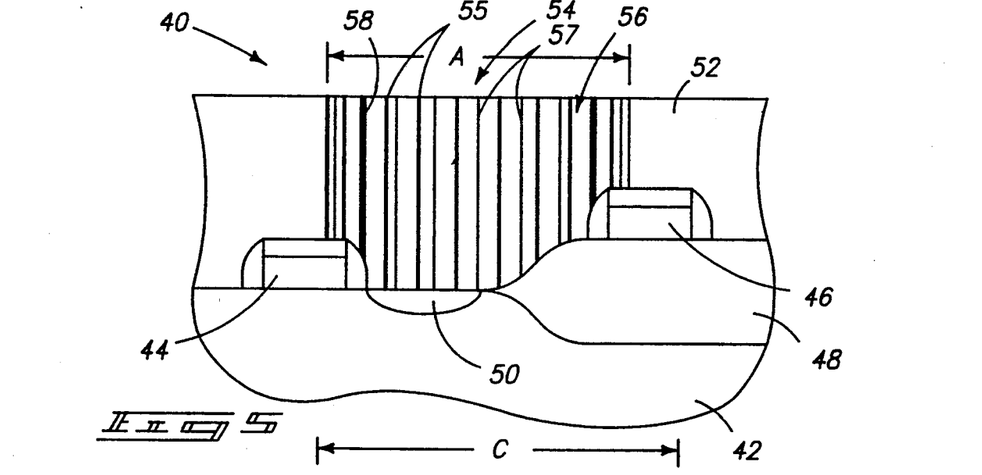
FIG. 5 is a cross sectional/elevational view of a semiconductor wafer fragment processed in accordance with the invention.

More particularly and with reference to the figures, FIG. 5 illustrates a semiconductor wafer fragment 40 comprised of a bulk silicon substrate 42, word lines 44, 46, field oxide region 48, and active area 50. A layer 52 of insulating dielectric, such as $SiO_2$, is also provided to a selected thickness. A unique capacitor contact opening 54 is etched through insulating layer 52 to upwardly expose contact opening 54.

Figure 6:
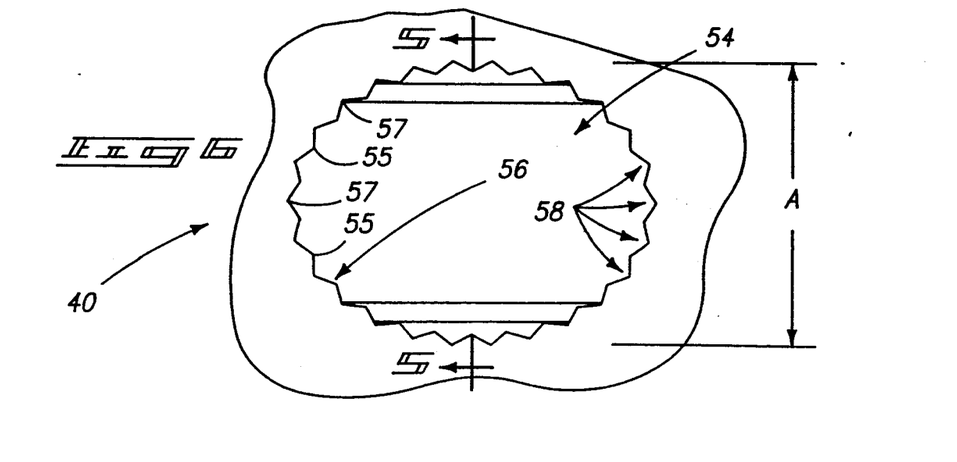
FIG. 6 is a top view of the FIG. 5 wafer fragment, with the line 5—5 illustrating where the FIG. 5 section cut is taken.

More specifically, contact opening 54 results from a selective anisotropic dry etch in a dry etching reactor to produce a minimum selected open dimension "A" into insulating dielectric layer 52. A wider open dimension "C" for contact opening 54 results from the elliptical shape. Such etching is conducted utilizing selected gas flow rates of a reactive gas component and an inert gas bombarding component. The flow rate of the bombarding component significantly and effectively exceeds the flow rate of the reactive component to produce capacitor contact opening 54 having grooved striated sidewalls 56. As illustrated, striated sidewalls have peak ridges 55 and low valleys 57, which define (for purposes of the continuing discussion) female capacitor contact opening striations 58. Effective excess flow of an inert gas bombarding component, as compared to the reactive gas component, has been determined to enable controllable production of the illustrated striations.

The bombarding gas component is preferably selected from the group consisting of argon, krypton and xenon or mixtures thereof. The invention was reduced to practice utilizing argon. The reactive gas component need be reactive with the insulating material of layer 52. Where such layer comprises $SiO_2$, reactive gas components of $CF_4$ and $CHF_3$ would be operable. Preferably, the flow rate to the reactor of the bombarding gas component is sufficient to produce a partial pressure of bombarding gas within the reactor of greater than or equal to about 31 mTorr.

Figure 7:
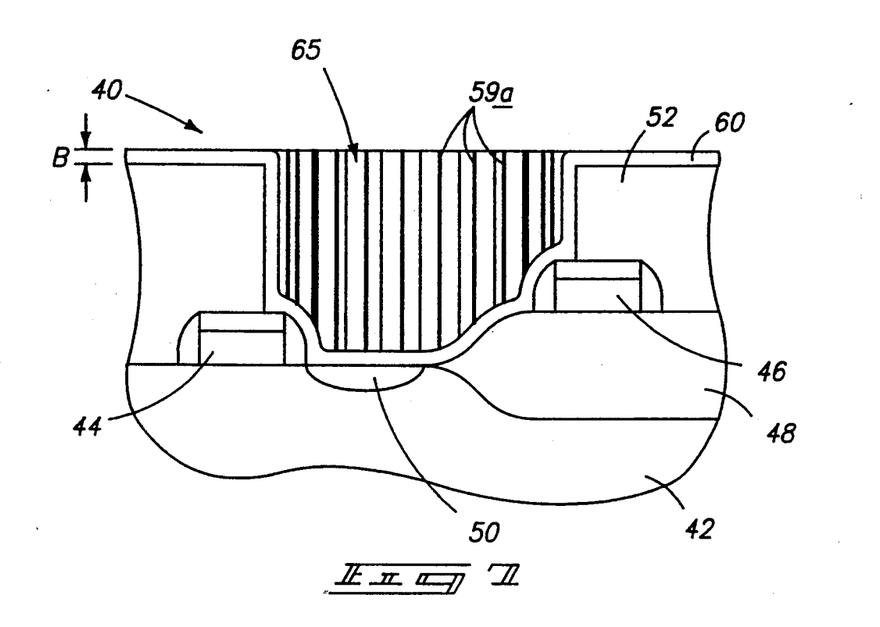
FIG. 7 is a cross sectional/elevational view of the FIG. 5 wafer fragment illustrated at a processing step subsequent to that shown by FIGS. 5 and 6.
Figure 8:
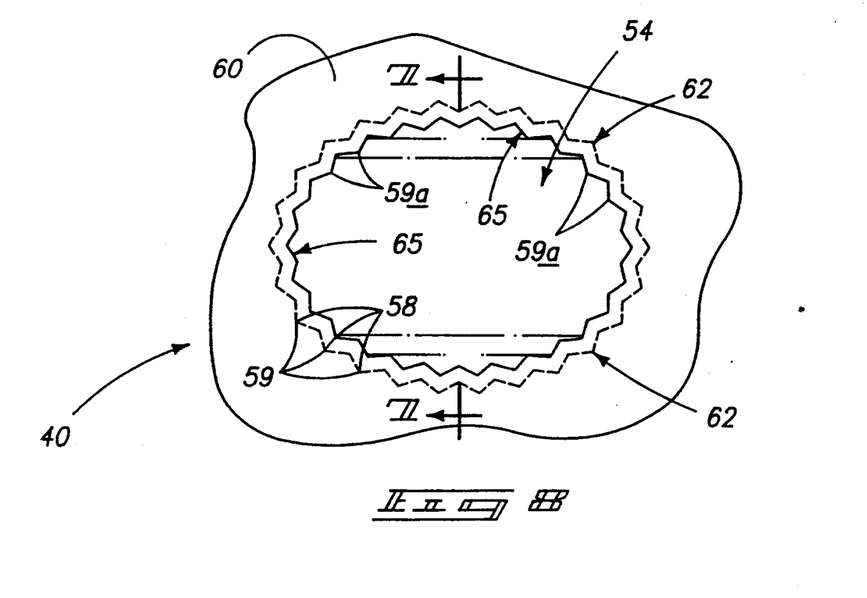
FIG. 8 is a top view of the FIG. 7 wafer fragment, with the line 7—7 illustrating where the FIG. 7 section cut is taken.

Argon, $CF_4$ and $CF_3$ are known prior art components for etching smooth-walled contact openings through $SiO_2$ layers, but not utilized in the manner claimed in this document. For example, a conventional prior art process for etching a prior art contact opening 24 (FIG. 1) into a $SiO_2$ layer of dielectric in an Applied Materials P5000 TM etcher includes argon at 50 sccm, $CF_4$ at 20 sccm, and $CHF_3$ at 25 sccm, providing a total reactor pressure of 100 mTorr. Such provides a partial pressure of argon within the reactor of approximately 50 mTorr, with such an etch producing substantially smooth contact opening sidewalls. This invention was reduced to practice, in part, utilizing the same Applied Materials P5000 TM reactor and flow rates of Ar at 90 sccm, $CF_4$ at 20 sccm, and $CHF_3$ at 25 sccm. Total reactor pressure was 50 mTorr, power supplied was 700, magnetic field strength was 75 gauss, oxide thickness was 2 microns, and the runs were conducted for 300 seconds. The P5000 TM etcher has an internal volume of 4.6 liters, which produced a partial pressure of Ar at a 90 sccm flow rate of 31 mTorr. Example runs were also conducted at Ar flow rates of 60 sccm and 110 sccm, with the flow rates of $CF_4$ and $CHF_3$ for each such run being maintained at 20 sccm and 25 sccm, respectively. The 60 sccm Ar flow rate example produced no striations, while the 110 sccm Ar flow rate produced significant striations equal or greater in magnitude than that produced by the 90 sccm example above. From such data, it is apparent that the desired striations can be produced where the flow rate of the bombarding gas component significantly exceeds the flow rate of the reactive component in an amount sufficient to effectively produce grooved striated contact opening sidewalls and thereby define female capacitor contact opening striations Referring to FIGS. 7 and 8, a layer 60 of electrically conductive material such as conductively doped polysilicon, is provided atop wafer 10 and within striated capacitor contact opening 54 to a selected thickness "B" which is less than the selected open dimension "A". Electrically conductive material 60 fills grooved striations 58 of capacitor contact opening 54. This thereby defines a striated external conductive material sidewall 62 within capacitor contact opening 54 which has external male striations 59 which are complementary in shape to female capacitor contact opening striations 58. Selected thickness "B" is most preferably less than or equal to about 30% of minimum selected open contact dimension "A" to provide sufficient space within contact opening 54 for subsequent provision of a capacitor dielectric layer and cell polysilicon layer. An example preferred thickness for poly layer 60 would be 1200 Angstroms. Such could be deposited by known techniques, and thereafter further texturized as desired. As illustrated, striations from external conductive material sidewall 62 transfer to an internal conductive material sidewall 65, producing internal male striations 59a.

Figure 9:
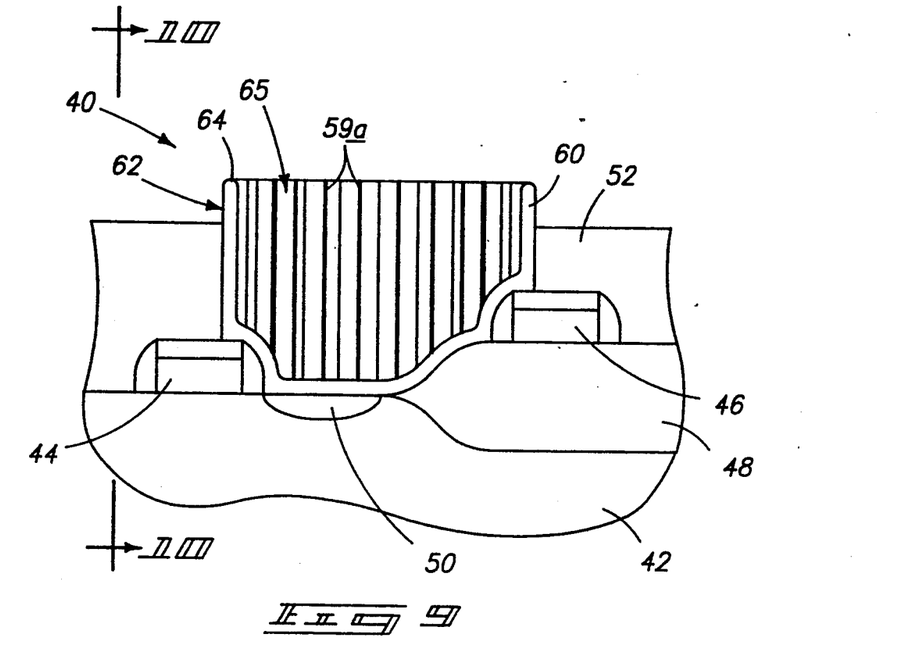
FIG. 9 is a cross sectional/elevational view of the FIG. 5 wafer fragment illustrated at a processing step subsequent to that shown by FIGS. 7 and 8.
Figure 10:
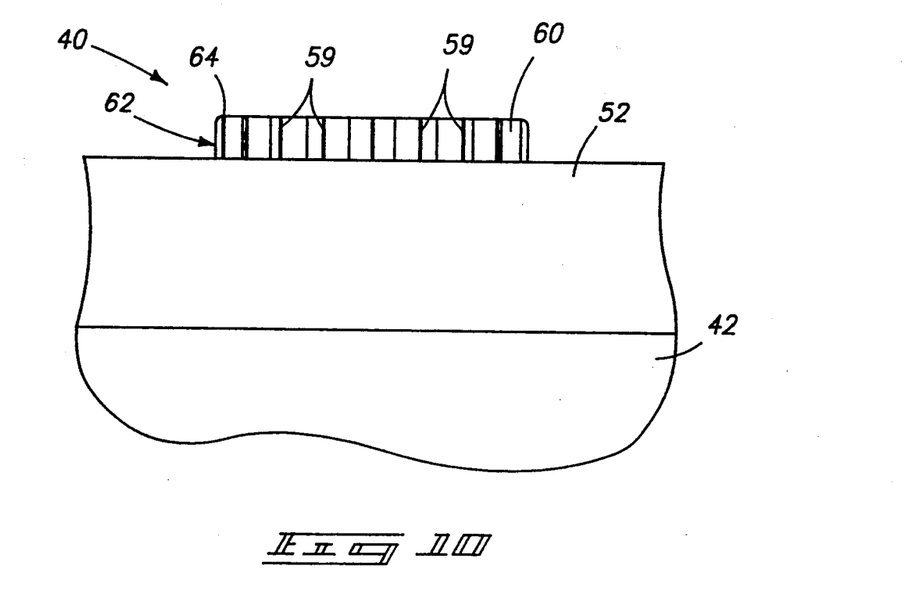
FIG. 10 is a cross sectional/elevational view of the FIG. 9 wafer fragment taken through line 10—10 in FIG. 9.

Referring to FIGS. 9 and 10, thickness "B" of polysilicon layer 60 is removed atop dielectric 52 by a conventional polish or etching technique to define an isolated capacitor storage node within insulating dielectric layer 52. Insulating dielectric layer 52 is then selectively etched relative to polysilicon layer 60 to expose at least a portion of external male striated conductive material sidewalls 62 and associated external male striations 59 (FIG. 10.)

Figure 11:
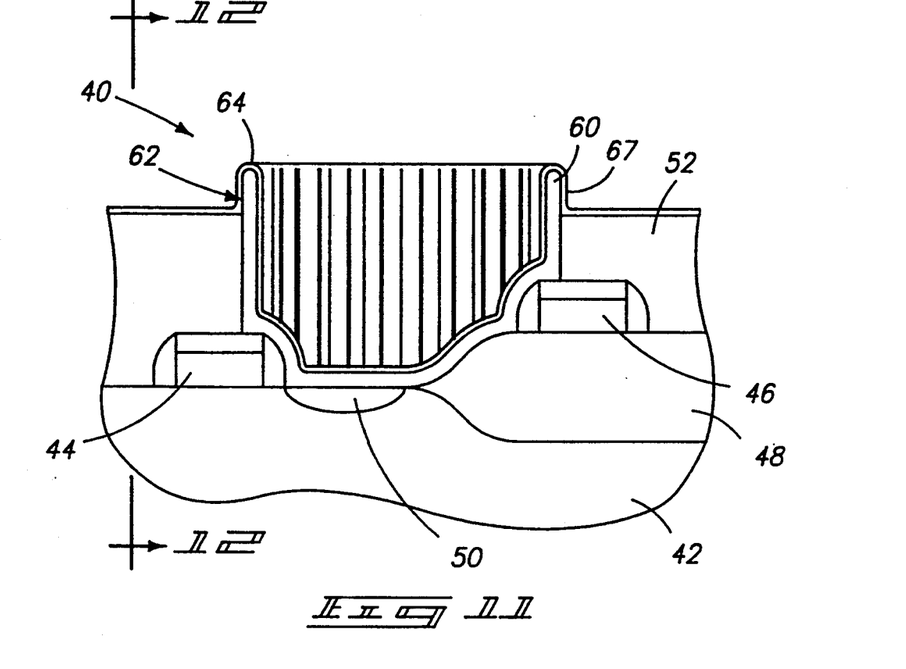
FIG. 11 is a cross sectional/elevational view of the FIG. 5 wafer fragment illustrated at a processing step subsequent to that shown by FIGS. 9 and 10.
Figure 12:
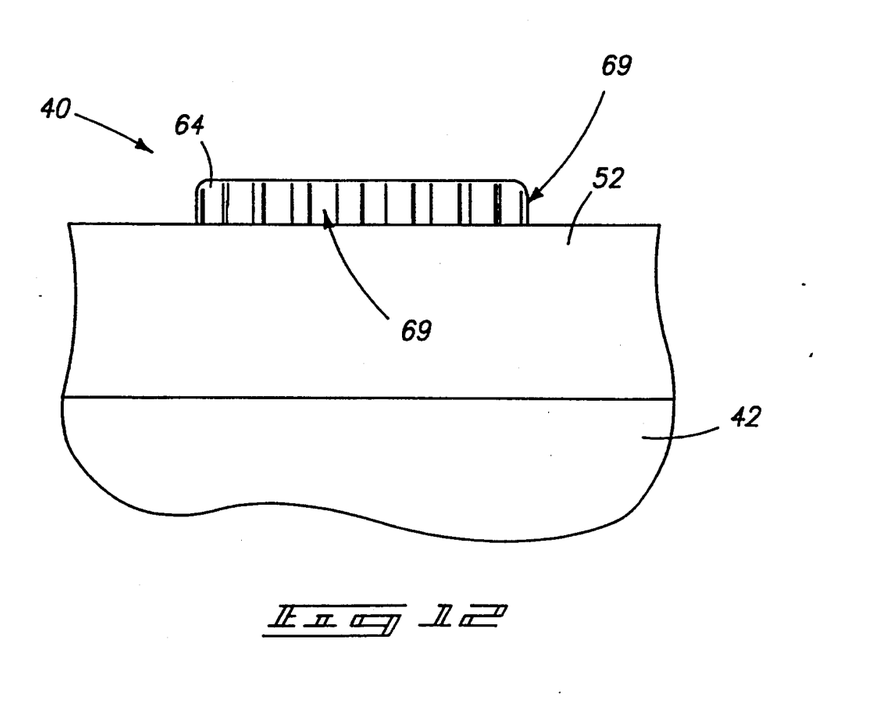
FIG. 12 is a cross sectional/elevational view of the FIG. 11 wafer fragment taken through line 12—12 in FIG. 11.

Referring to FIGS. 11 and 12, a conformal capacitor dielectric layer 64 such as $Si_3N_4$, is conformally deposited atop the etched conductive material 60 and over its exposed striated sidewalls 62. Such striations translate through capacitor dielectric layer 64 such that its external surface 67 is as well striated. Additionally, internal conductive material striations 59a translate to striate internal capacitor dielectric material sidewalls 69.

Figure 13:
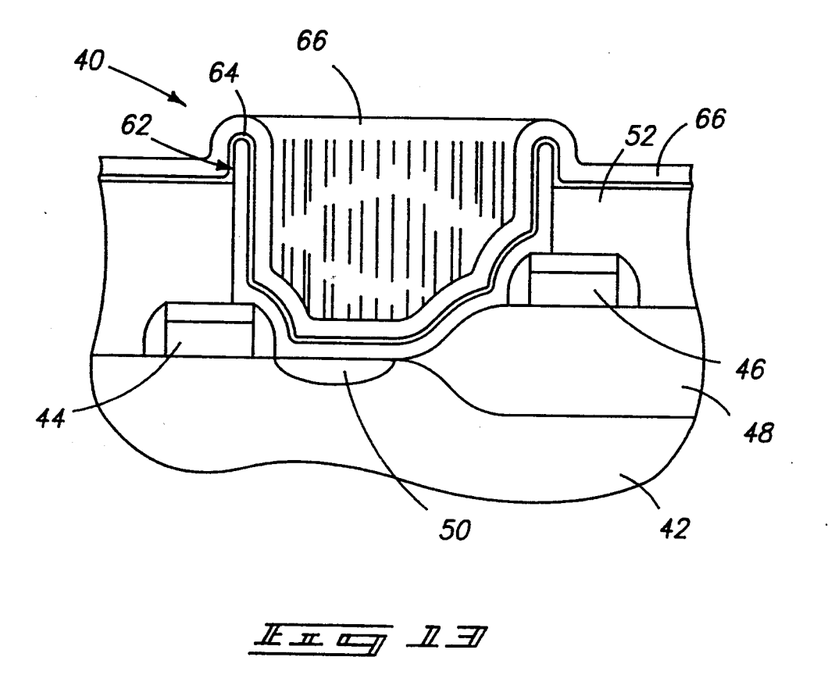
FIG. 13 is a cross sectional/elevational view of the FIG. 5 wafer illustrated at a processing step subsequent to that shown by FIG. 12.

Referring to FIG. 13, a conformal capacitor cell layer 66 of conductive material, such as conductively doped polysilicon, is conformally deposited atop capacitor dielectric layer 64. Striations from internal and external surfaces of layer 64 will probably only partially translate to outer surfaces of layer 66 due to the increasing thickness and corresponding smoothing effect imparted by subsequent layers. Layers 66 and 64 may be subsequently etched, as desired, to pattern desired capacitor constructions.

Figure 14:
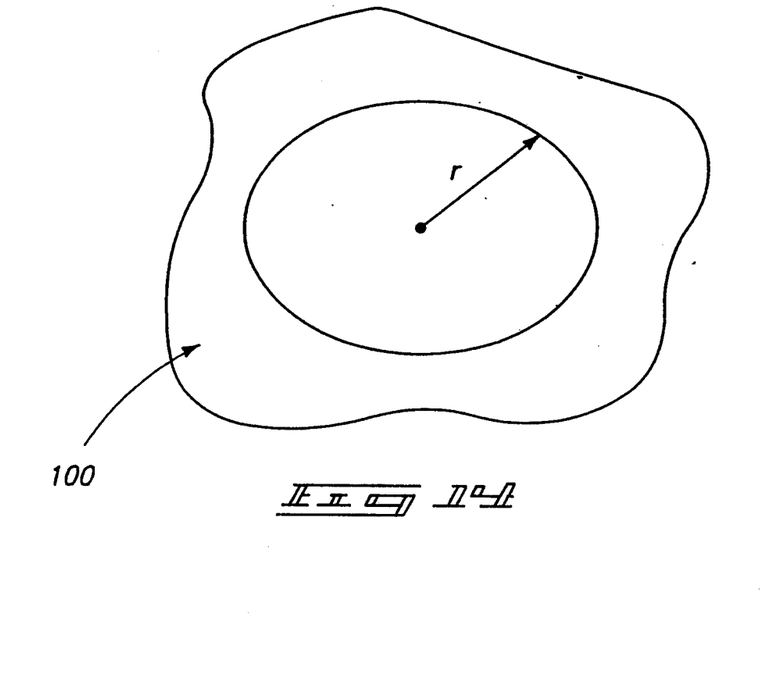
FIG. 14 is a top view of a prior art capacitor contact opening.
Figure 15:
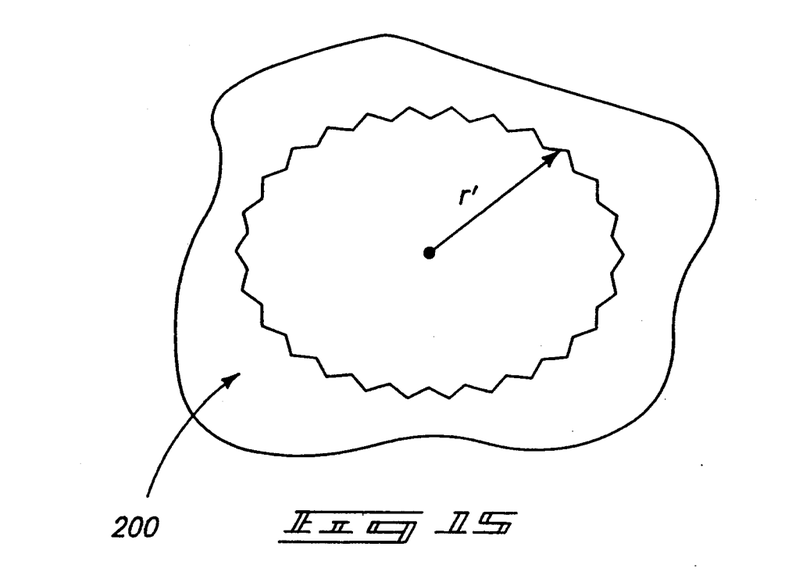
FIG. 15 is a top view of a capacitor contact opening produced in accordance with the invention.

The above-described technique and construction increases contact sidewall surface area significantly over the prior art for maximization of capacitance for a given photo feature size. The prior art embodiment of FIGS. 1-4 and the embodiment of the invention of FIGS. 5-13 utilize the same photo tool. Yet, a greater surface area of the contact opening is produced as a result of the described anisotropic dry etch which effectively increases the radius of the inventive contact over that of the standard prior art contact. The effect is shown in contrast in FIGS. 14 and 15. FIG. 14 shows a prior art contact 100, while FIG. 15 shows a contact 200 in accordance with the invention, both of which are made from the same photo tool. Contact 100 has some effective or average radius "r", while contact 200 has an effective or average radius "r" which is slightly greater than "r", thus increasing surface area.

The intent is to maximize flow of the bombarding component, while minimizing total reactor pressure, and thereby increase the flow rate of argon relative to the reactive gas components. The invention functions by providing a pretexturized, striated surface before polysilicon is deposited to maximize surface area in both external and internal portions of the deposited polysilicon. The resultant product is improved over the prior art the result of increased capacitance.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a capacitor on a semiconductor wafer comprising the following steps:

providing a layer of insulating dielectric atop a semiconductor wafer to a selected thickness;

in a dry etching reactor, selectively anisotropically dry etching a capacitor contact opening having a minimum selected open dimension into the insulating dielectric layer utilizing selected gas flow rates of a reactive gas component and an inert gas bombarding component, the flow rate of the bombarding component significantly exceeding the flow rate of the reactive component to effectively produce a capacitor contact opening having grooved striated sidewalls and thereby defining female capacitor contact opening striations;

providing a layer of electrically conductive material atop the wafer and within the striated capacitor contact opening to a selected thickness which is less than the selected open dimension, the electrically conductive material filling the grooved striations of the capacitor contact opening thereby defining striated external conductive material sidewalls within the capacitor contact opening which are male complementary in shape to the female capacitor contact opening striations;

removing at least a portion of the conductive material layer to define an isolated capacitor storage node within the insulating dielectric;

etching the insulating dielectric layer selectively relative to the conductive material sufficiently to expose at least a portion of the external male striated conductive material sidewalls;

providing a conformal capacitor dielectric layer atop the etched conductive material and over its exposed striated sidewalls; and providing a conformal capacitor cell layer of electrically conductive material atop the capacitor dielectric layer.

2. The method of forming a capacitor of claim 1 wherein the bombarding gas component is selected from the group consisting of argon, krypton and xenon, or mixtures thereof.

3. The method of forming a capacitor of claim 1 wherein the bombarding gas component comprises argon.

4. The method of forming a capacitor of claim 1 wherein the insulating dielectric comprises $SiO_2$, and the reactive gas component comprises $CF_4$ and $CHF_3$.

5. The method of forming a capacitor of claim 4 wherein the bombarding gas component is selected from the group consisting of argon, krypton and xenon, or mixtures thereof.

6. The method of forming a capacitor of claim 4 wherein the bombarding gas component comprises argon.

7. The method of forming a capacitor of claim 1 wherein the selected thickness of the conductive material is less than or equal to about 30% of the minimum selected open contact dimension.

8. The method of forming a capacitor of claim 1 wherein the electrically conductive material comprises conductively doped polysilicon.

9. The method of forming a capacitor of claim 1 wherein the electrically conductive material comprises conductively doped polysilicon, with the selected thickness being less than or equal to about 30% of the minimum selected open contact dimension.

10. The method of forming a capacitor of claim 1 wherein the bombarding gas component flow rate to the reactor is sufficient to provide a partial pressure of bombarding gas within the reactor of greater than or equal to about 31 mTorr, at a total reactor pressure of 50 mTorr or less.

11. The method of forming a capacitor of claim 1 wherein the bombarding gas component is selected from the group consisting of argon, krypton and xenon, or mixtures thereof, and is provided at a flow rate to the reactor which is sufficient to produce a partial pressure of bombarding gas within the reactor of greater than or equal to about 31 mTorr, at a total reactor pressure of 50 mTorr or less.

12. The method of forming a capacitor of claim 1 wherein the insulating dielectric comprises $SiO_2$, the reactive gas component comprises $CF_4$ and $CHF_3$, and the bombarding gas component flow rate to the reactor is sufficient to provide a partial pressure of bombarding gas within the reactor of greater than or equal to about 31 mTorr, at a total reactor pressure of 50 mTorr or less.

13. The method of forming a capacitor of claim 1 wherein the bombarding gas component comprises argon, and is provided at a flow rate to the reactor which is sufficient to produce a partial pressure of bombarding gas within the reactor of greater than or equal to about 31 mTorr, at a total reactor pressure of 50 mTorr or less.

14. The method of forming a capacitor of claim 1 wherein the insulating dielectric comprises $SiO_2$, the reactive gas component comprises $CF_4$ and $CHF_3$, the bombarding gas component comprises argon, and the bombarding gas component flow rate to the reactor is sufficient to provide a partial pressure of bombarding gas within the reactor of greater than or equal to about 31 mTorr, at a total reactor pressure of 50 mTorr or less.

* * * * *